United States Patent
Joo

(10) Patent No.: US 9,142,310 B1
(45) Date of Patent: Sep. 22, 2015

(54) NONVOLATILE MEMORY DEVICE AND MERTHOD OF OPERATING THE SAME

(71) Applicant: SK HYNIX INC., Icheon (KR)

(72) Inventor: Byoung In Joo, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/473,337

(22) Filed: Aug. 29, 2014

(30) Foreign Application Priority Data

Apr. 7, 2014 (KR) .................. 10-2014-0041015

(51) Int. Cl.
*G11C 16/04* (2006.01)
*G11C 16/26* (2006.01)
*G11C 16/24* (2006.01)

(52) U.S. Cl.
CPC .............. *G11C 16/26* (2013.01); *G11C 16/24* (2013.01)

(58) Field of Classification Search
CPC . G11C 16/26; G11C 11/5621; G11C 11/5642
USPC ........................... 365/185.12, 189.09, 189.15
See application file for complete search history.

(56) References Cited

U.S. PATENT DOCUMENTS

| | | | |
|---|---|---|---|
| 6,226,212 B1 * | 5/2001 | Sakamoto et al. ............. | 365/207 |
| 6,462,998 B1 * | 10/2002 | Proebsting .................... | 365/205 |
| 9,064,590 B2 * | 6/2015 | Ueda ..................................... | 1/1 |
| 2002/0001207 A1 * | 1/2002 | Kishimoto et al. ............. | 363/59 |
| 2006/0044874 A1 * | 3/2006 | Tokiwa .................... | 365/185.21 |
| 2008/0147968 A1 * | 6/2008 | Lee et al. ....................... | 711/103 |
| 2009/0161451 A1 * | 6/2009 | Kim ............................. | 365/191 |
| 2013/0128675 A1 | 5/2013 | Kim et al. | |

FOREIGN PATENT DOCUMENTS

KR 10-2013-0056004 A 5/2013

* cited by examiner

*Primary Examiner* — Tuan T Nguyen

(57) ABSTRACT

A nonvolatile memory device includes a control circuit that generates an integrated activation signal based on a read command signal for instructing start of an read operation and a ready/busy signal, and simultaneously generates a voltage control signal and a path control signal in response to the integrated activation signal, a voltage providing circuit that generates voltages used to perform the read operation in response to the voltage control signal, and path control circuits that control electrical path connection to a memory cell array in which the read operation is performed in response to the path control signal.

15 Claims, 6 Drawing Sheets

NONVOLATILE MEMORY DEVICE AND MERTHOD OF OPERATING THE SAME

CROSS-REFERENCES TO RELATED APPLICATION

The present application claims priority to Korean Patent Application Number 10-2014-0041015, filed on Apr. 7, 2014, the disclosure of which is incorporated by reference herein in its entirety.

BACKGROUND

1. Technical Field

Embodiments of the present disclosure relate to a nonvolatile memory device and a method of operating the same, and more particularly, to a nonvolatile memory device including circuitry to control a read operation, and a method of operating the nonvolatile memory device.

2. Related Art

Memory devices are classified as volatile memory devices and nonvolatile memory devices according to whether stored data is retained or not when a power source is off.

Flash memory devices are a representative type of nonvolatile memory devices. In a memory cell in a flash memory device, a threshold voltage of the memory cell is determined by an amount of charges stored therein through Fowler-Nordheim (F-N) tunneling between a floating gate and a control gate, and data is stored in the memory cell according to the threshold voltage.

SUMMARY

Embodiments of the present disclosure are directed to a nonvolatile memory device capable of simplifying a process of generating control commands for performing a read operation by substantially simultaneously executing a plurality of control signals to perform the read operation in response to a read command signal, and a method of operating the nonvolatile memory device.

Embodiments are also directed to a nonvolatile memory device capable of preventing a delay in operation due to voltage generation by reducing a number of processes performed before voltages, which are used to perform a read operation are generated, and a method of operating the nonvolatile memory device.

According to an aspect of an embodiment, there is provided a nonvolatile memory device. The nonvolatile memory device may include a control circuit that generates an integrated activation signal based on a read command signal instructing start of a read operation and a ready/busy signal, and substantially simultaneously generates a voltage control signal and a path control signal in response to the integrated activation signal, a voltage providing circuit that generates voltages used to perform the read operation in response to the voltage control signal, and path control circuits that control an electrical path connection to a memory cell array in which the read operation is performed in response to the path control signal.

According to an aspect of an embodiment, there is provided a method of operating a nonvolatile memory device. The method may include generating an integrated activation signal based on a read command signal instructing start of a read operation and a ready/busy signal, and generating, at substantially the same point of time, control signals for controlling generation of voltages used to perform the read operation and control signals for controlling electrical paths through which the generated voltages are provided to a memory cell array, in response to the integrated activation signal.

A nonvolatile memory device and a method of operating the same according to embodiments of the present disclosure may minimize the time it takes to perform a read operation by simultaneously generating control signals for activating operations of a plurality of components of the nonvolatile memory device in response to a signal instructing the start of the read operation.

A nonvolatile memory device and a method of operating the same according to embodiments of the present disclosure may simplify a process for implementing a read operation by simultaneously generating control signals for activating operations of a plurality of components through a simple logic processing process in response to a signal for instructing the start of the read operation.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Figure 1:
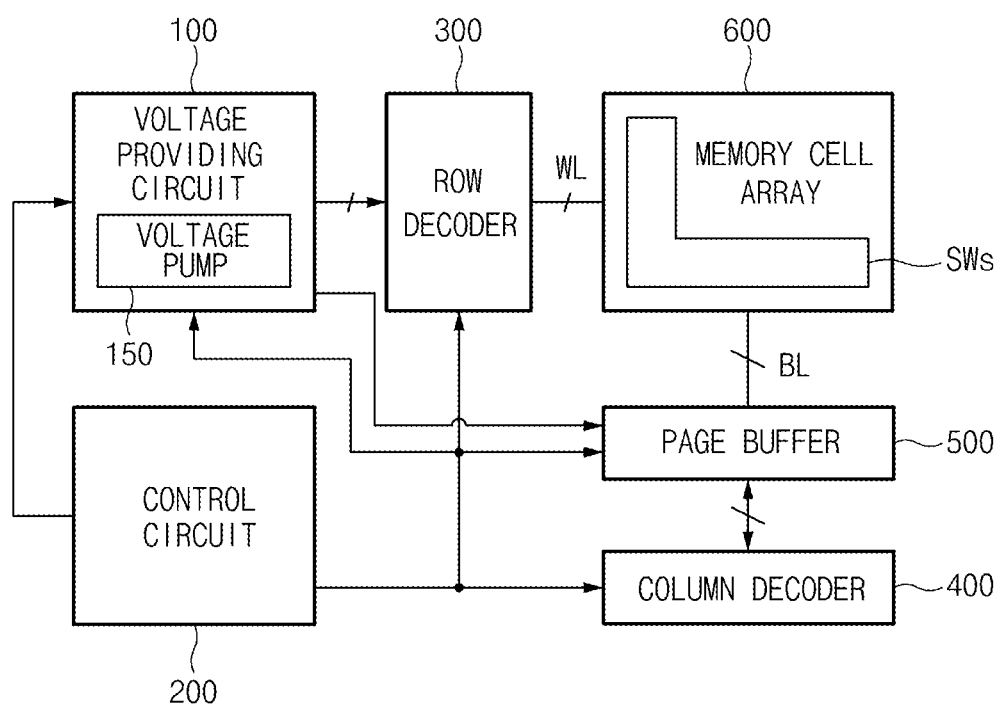
FIG. 1 illustrates a nonvolatile memory device according to an embodiment of the present disclosure.

Hereinafter, various embodiments of the present disclosure will be described with reference to the accompanying drawings. Like reference numerals in the drawings denote like elements, and overlapping description for the same elements will be omitted.

Embodiments may be described herein with reference to specific structures and functions, which may be represented as schematic illustrations of embodiments of the present disclosure. However, embodiments of the present invention should not be construed as limited to the embodiments specifically described in the present disclosure. Although a few embodiments will be shown and described, it will be appreciated by those of ordinary skill in the art that changes may be made in these embodiments without departing from the principles and spirit of the present disclosure.

Functions or operations denoted in specific blocks may be performed in an order different from the order denoted in a flowchart when some embodiments are differently implemented. For example, two sequential blocks in a flowchart may be substantially simultaneously performed, or the sequential two blocks may be performed in the reverse or another order according to related functions or operations.

FIG. 1 illustrates a nonvolatile memory device according to an embodiment of the present disclosure. The nonvolatile memory device 10 includes a voltage providing circuit 100, a control circuit 200, a row decoder 300, a column decoder 400, a page buffer 500, and a memory cell array 600. However, embodiments are not limited thereto. That is, in some embodiments, the nonvolatile memory device 10 may include one or more other components in addition to the above components.

The voltage providing circuit 100 generates voltages used for various operations of the nonvolatile memory device 10. In some embodiments, the voltage providing circuit 100 includes a voltage pump 150 that pumps a power voltage to a high level in synchronization with an oscillation signal.

In some embodiments, the voltage providing circuit 100 generates voltages that are used to perform a read operation. Such voltages include voltages applied to word lines WL of the memory cell array 600 and voltages applied to bit lines BL of the memory cell array 600. Further, the voltage providing circuit 100 generates voltages having different voltage levels depending on a programming operation, an erase operation, or a verifying operation of the nonvolatile memory device 10, and provides the generated voltages to other components.

In a read operation of the nonvolatile memory device 10, a read voltage Vread is applied to a word line coupled to the memory cell array 600 from which data is to be read. That is, the read voltage Vread is applied to a selected word line from the voltage providing circuit 100, and a pass voltage Vpass is applied to non-selected word lines from the voltage providing circuit 100. Further, to perform the read operation, voltages applied to path gates (or selection switches SWs) may be used. The path gates SWs are provided to activate/deactivate electrical paths coupled to the selected word line and the non-selected word lines and electrical paths coupled to a plurality of bit lines so as to perform the read operation on memory cells coupled to the selected word line and the bit lines in a memory block of the memory cell array 600. In an embodiment, the memory cell array 600 includes a plurality of memory blocks, each of which includes a plurality of memory cells.

The voltages in the voltage providing circuit 100 are generated after a certain amount of time passes. Therefore, after a read command signal READ is applied to the nonvolatile memory device 10, if the voltages are generated through a sequence of control processes, the total time used to perform the read operation inevitably increases.

For example, after the read operation starts, if a series of processes are sequentially performed, including generating an oscillation signal used in the voltage providing circuit 100, generating a high power voltage using the voltage pump 150 in response to the oscillation signal, and activating electrical paths coupled to the word lines WL and the bit lines BL of the memory cell array 600 using the high power voltage, a time taken for performing the read operation is determined by a time required for performing each of the above processes and a delay that may occur between two sequentially executed processes. As a result, as the time it takes to perform each of the above processes and/or the number of the above processes increase, the time it takes to perform the read operation also increases.

In accordance with an embodiment, the nonvolatile memory device 10 substantially simultaneously performs the above-described processes based on various control signals which are substantially simultaneously generated in the control circuit 200 in response to an integrated control signal SMARTMC.

The voltage providing circuit 100 may activate the oscillation signal to operate the voltage pump 150 during the read operation based on a control signal provided from the control circuit 200, so that the voltage providing circuit 100 generates the voltages used to perform the read operation. At the same time, the voltage providing circuit 100 may generate a voltage for selecting a memory block in which the read operation is performed or a voltage provided through a bit line.

The control circuit 200 may include a new logic capable of allowing a plurality of operations accompanied with a read command to be simultaneously controlled based on a single command. Therefore, as a plurality of components for performing the plurality of operations operates in parallel in response to the single command, the time required for performing the read operation may be minimized.

The control circuit 200 generates the integrated activation signal SMARTMC based on the read command signal READ and a ready/busy signal RBb. The integrated activation signal SMARTMC may allow operations of the voltage providing circuit 100, the row decoder 300, the page buffer 500, the column decoder 400, and the memory cell array 600 to be simultaneously controlled to perform the read operation.

The control circuit 200 may generate control signals for operations to be performed in the voltage providing circuit 100, control signals for operations to be performed in the row decoder 300, control signals for operations to be performed in the page buffer 500, and control signals for operations to be performed in the column decoder 400, in response to the integrated activation signal SMARTMC, and provide the control signals to the respective components. In some embodiments, the control circuit 200 includes a control logic that generates a plurality of control signals in response to the integrated activation signal SMARTMC.

The plurality of control signals generated in response to the integrated activation signal SMARTMC in the control circuit 200 may be classified to a voltage control signal and a path control signal.

The voltage control signal controls generation of the voltages used to perform the read operation. The voltage control signal may include any of a control signal for activating the voltage pump 150 of the voltage providing circuit 100 to generate a high voltage, an oscillation signal that is used as a reference signal for an operation of the voltage bump 150, and the like.

Here, the voltages used to perform the read operation may include a voltage applied to a selected word line of the memory cell array 600, a voltage applied to a non-selected word line of the memory cell array 600, and a voltage provided to a bit line of the memory cell array via path control circuits. The path control circuits may include the row decoder 300 coupled to a word line WL of the memory cell array 600, the page buffer 500 coupled to a bit line BL of the memory cell array 600, and switches SWs that control electrical path connections to word lines and bit lines of the memory cell array 600.

The path control signals control activation of electrical paths so as to provide the voltages generated in the voltage providing circuit 100 to the respective components, e.g., the word lines and the bit lines, in the nonvolatile memory device 10. Electrical paths of the above-described path control circuits may be controlled by the path control signals. Further, the path control signals may control electrical paths to transfer data, which read from the memory cell array 600 as a result of the read operation, to an output circuit for outputting the read-out data to an external device.

For example, the path control signals may include a block selection signal that selects a memory block of the memory cell array 600 and signals that control activation of the switches SWs.

The row decoder 300 operates in response to a row decoder activation signal RDCEN that is generated in response to the integrated activation signal SMARTMC. The row decoder 300 may provide the read voltage Vread, the pass voltage Vpass, a verifying voltage Vvrf, an erase voltage Verase, or the like, which is provided from the voltage providing circuit 100, to the memory cell array 600 via a word line WL selected based on an address signal.

The column decoder 400 operates to provide a data input path to the memory cell array 600 or a data output path from the memory cell array 600 based on an address signal.

The page buffer 500 is coupled to the memory cell array 600 through a bit line BL. The page buffer 500 may temporarily store data to be programmed in the memory cell array 600 and then provide the stored data to the memory cell array 600 through a bit line BL, or temporarily store data read from the memory cell array 600.

The page buffer 500 operates in response to a control signal, which is provided from the control circuit 200 in response to the integrated activation signal SMARTMC, activates an electrical path coupled to a specific bit line BL, and provides a core voltage Vcore to the bit line BL through the activated electrical path. The core voltage Vcore may be generated by the voltage providing circuit 100.

In the nonvolatile memory device 10 according to an embodiment of the present disclosure, the control circuit 200 simultaneously generates control signals for activating operations associated with the read operation in response to the read command signal READ and the ready/busy signal RBb. In an embodiment, the ready/busy signal RBb is activated when a predetermined time elapses after the read command signal READ is activated.

On the other hand, in the related art, when a ready/busy signal RBb is activated after the read command signal READ is input, the read operation is performed through a plurality of sequential processes. Specifically, after a high voltage is generated in the voltage providing circuit 100 and a core voltage Vcore is provided to a bit line through the page buffer 500, the row decoder 300 and the switches SWs are sequentially activated. This is because control signals for controlling the respective operations associated with the read operation are sequentially generated according to a sequential logic procedure.

Since, however, in embodiments of the present disclosure, various control signals are provided based on the integrated activation signal SMARTMC, which controls a plurality of operations, operations of the voltage providing circuit 100, the page buffer 500, the row decoder 300, and the switches SWs may be simultaneously controlled. As a result, the total time taken to perform the read operation after the read command signal READ is input may be reduced.

An operation of the control circuit according to an embodiment will be described in detail with reference to FIG. 2.

Figure 2:
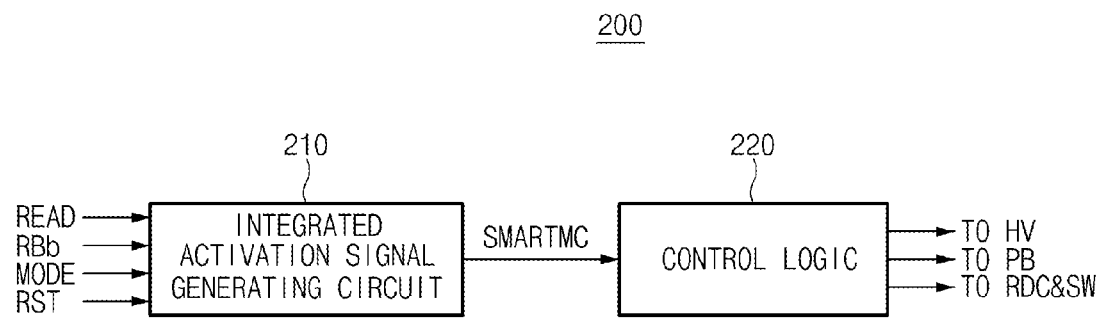
FIG. 2 illustrates a control circuit according to an embodiment of the present disclosure.

FIG. 2 illustrates a control circuit according to an embodiment. The control circuit 200 includes an integrated activation signal generating circuit 210 and a control logic 220.

The integrated activation signal generating circuit 210 generates the integrated activation signal SMARTMC based on a mode signal MODE, the read command signal READ, and the ready/busy signal RBb.

In another embodiment, the integrated activation signal generating circuit 210 initiates the integrated activation signal SMARTMC based on a reset signal RST. For example, the integrated activation signal SMARTMC turns low responding to the reset signal RST.

The control logic 220 simultaneously generates control signals used to control operations of the voltage providing circuit 100 (HV), the page buffer 500 (FB), the row decoder 300 (RDC), and the switches SWs in response to the integrated activation signal SMARTMC provided from the integrated activation signal generating circuit 210, and provides the generated control signals to the respective components. As described above, the control signals generated in the control logic 220 may include a voltage control signal, which allows the voltages used to perform the read operation to be generated, and a path control signal, which controls electrical path connections to word lines and bit lines of the memory cell array 600 in which the read operation is performed. That is, the control logic 220 may generate control signals for controlling the generation of voltages in the voltage providing circuit 100 and control signals for controlling electrical paths through which the generated voltages are provided to the memory cell array 600, in response to the integrated activation signal SMARTMC.

In an embodiment of the present disclosure, the generation of the voltages and the control of electrical paths may be simultaneously performed in response to the voltage control signal and the path control signal, which are simultaneously generated in response to the integrated activation signal SMARTMC, and thus the total time taken to perform the read operation may be minimized.

Figure 3:
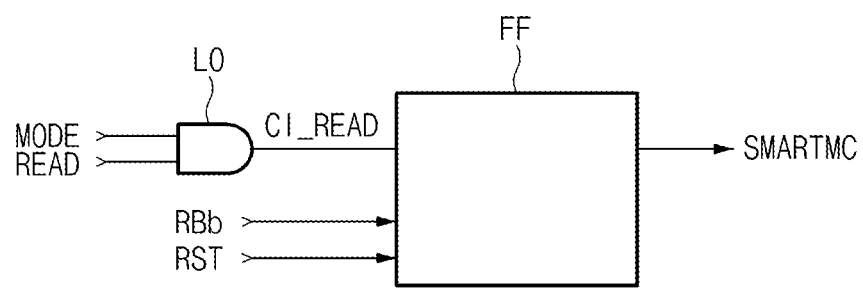
FIG. 3 illustrates an integrated activation signal generating circuit according to an embodiment of the present disclosure.

FIG. 3 illustrates an integrated activation signal generating circuit according to an embodiment of the present disclosure. The integrated activation signal generating circuit 210 includes a logic operator LO and a flip flop FF.

The logic operator LO generates a command interface read signal CI_READ based on the mode signal MODE and the read command signal READ. In some embodiments, the logic operator LO may perform an AND operation on the mode signal MODE and the read command signal READ. Therefore, in an embodiment, the command interface read signal CI_READ is activated only when both the mode signal MODE and the read command signal READ are simultaneously activated.

In a read operation, i.e., when the read command signal READ is activated, the logic operator LO provides the flip flop FF with the command interface read signal CI_READ that is activated in response to the mode signal MODE.

The flip flop FF outputs the command interface read signal CI_READ as the integrated activation signal SMARTMC in response to the ready/busy signal RBb. When the ready/busy signal RBb is activated in a state in which the read command signal READ is activated, the integrated activation signal SMARTMC may be activated in response to the command interface read signal CI_READ, and the above-described control signals may be generated in the control logic 220 of FIG. 2 in response to the integrated activation signal SMARTMC.

As described above, in the read operation, i.e., when both the read command signal READ and the ready/busy signal RBb are activated, the integrated activation signal SMARTMC is generated in response to the mode signal MODE since the command interface read signal CI_READ is activated in response to the mode signal MODE. Therefore, even if the read command signal READ is activated, the operations of the voltage providing circuit 100, the page buffer 500, and the row decoder 300 may not be simultaneously performed if the mode signal MODE is not activated.

For example, if the mode signal MODE is not activated, as in the related art, after the ready/busy signal RBb is activated, the voltage providing circuit 100, the page buffer 500, the row decoder 300, and the switches SWs may be sequentially activated at certain time intervals.

In another embodiment, the reset signal RST initiates the integrated activation signal SMARTMC. For example, the flip flop FF outputs the integrated activation signal SMARTMC having a predetermined logic state regardless of the read command signal READ and the ready/busy signal RBb. That is, the flip flop resets the integrated activation signal SMARTMC, such as a disabled state, in response to the reset signal RST.

Figure 4:
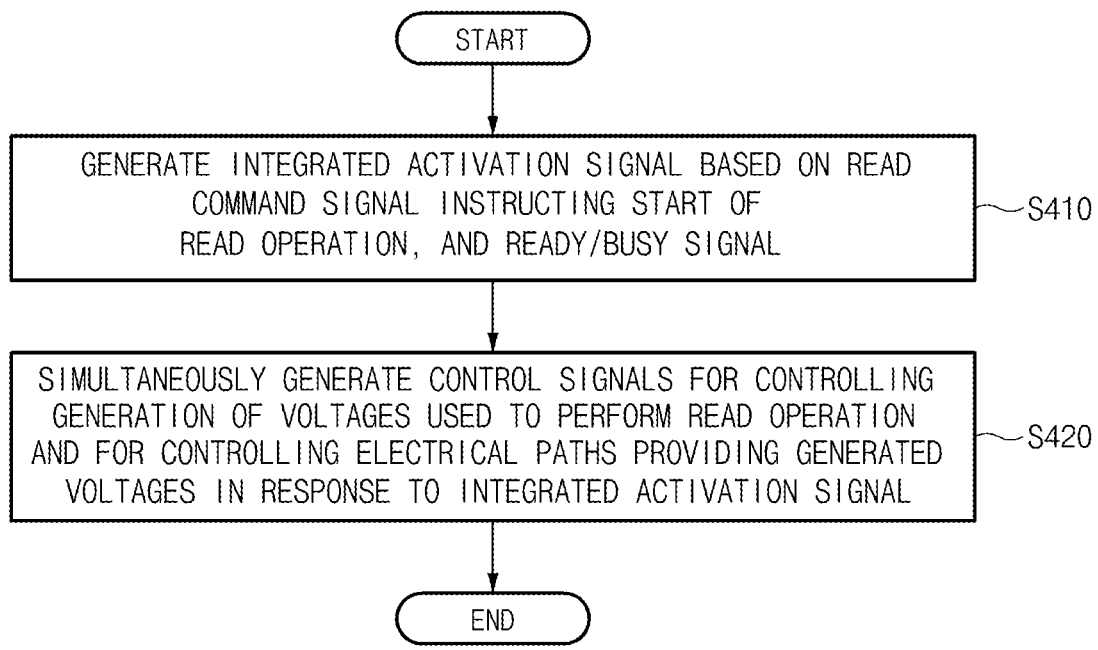
FIGS. 4 and 5 are flowcharts illustrating a method of operating a nonvolatile memory device according to an embodiment of the present disclosure.
Figure 5:
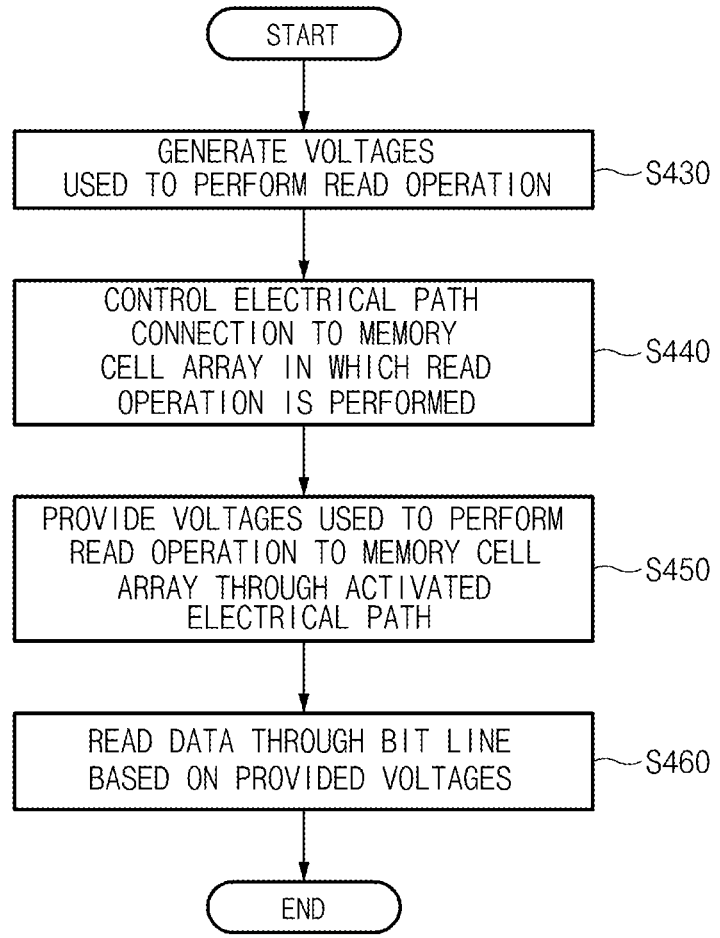

FIGS. 4 and 5 are flowcharts illustrating a method of operating a nonvolatile memory device according to an embodiment of the present disclosure. The method will be described with reference to FIGS. 1 to 3.

Referring to FIG. 4, at S410, the integrated activation signal generating circuit 210 included in the control circuit 200 generates the integrated activation signal SMARTMC based on the read command signal READ for instructing start of the read operation and the ready/busy signal RBb when the mode signal MODE is activated.

At S420, the control logic 220 generates control signals for controlling generation of voltages used to perform the read operation and control signals for controlling electrical paths through which the generated voltages are provided to respective components of the nonvolatile memory device, in response to the integrated activation signal SMARTMC.

In some embodiments, the voltages used to perform the read operation include voltages applied to a selected word line of the memory cell array 600, a voltage applied to a non-selected word line of the memory cell array 600, and voltages provided to path control circuits, such as the switches SWs that control electrical paths to the memory cell array 600, the page buffer 500, and the column decoder 400 that controls an electrical path to a bit line BL of a memory block.

As described above, the control signals generated in the control logic 220 may include the voltage control signal and the path control signal. A specific example of the voltage control signal and the path control signal will be described later with reference to FIG. 6.

Referring to FIG. 5, at S430, the voltage providing circuit 100 generates voltages used to perform the read operation based on a plurality of control signals provided from the control circuit 200. The voltage providing circuit 100 may generate the voltages by operating the voltage pump 150 in response to an oscillation signal.

At S440, in response to a plurality of control signals provided from the control circuit 200, the row decoder 300, the column decoder 400, the page buffer 500, and the switches SWs control an electrical path connection to the memory cell array 600 in which the read operation is performed so that electrical paths through which the voltages generated by the voltage providing circuit 100 are provided to the memory cell array 600 are activated. The electrical paths for providing the voltages to the memory cell array 600 may be also determined based on an address signal provided together with the read command signal READ from an external device.

At S450, the voltages used to perform the read operation are provided to the memory cell array 600 through the activated electrical paths. As described above, the voltages applied to the memory cell array 600 may be provided through word lines WL and bit lines BL of the memory cell array 600.

Since the steps S430 to S450 are performed in response to the simultaneously generated control signals, the steps S430 to S450 are almost simultaneously performed. In accordance with an embodiment of the present disclosure, since the steps S430 to S450 are almost simultaneously performed based on an integrated activation signal SAMRTMC, the operation time may be minimized.

At S460, the page buffer 500 reads data stored in the memory cell array 600 through a bit line BL based on an applied voltage. The page buffer 500 temporarily stores the data and then outputs the data to the outside. The data reading operation of the page buffer 500 is performed through an electrical path activated by the path control signal. That is, the electrical paths through which the generated voltages are provided to the memory cell array 600 as well as the electrical path for reading out data from the memory cell array 600 are activated by path control signals generated by the control circuit 200.

Figure 6:
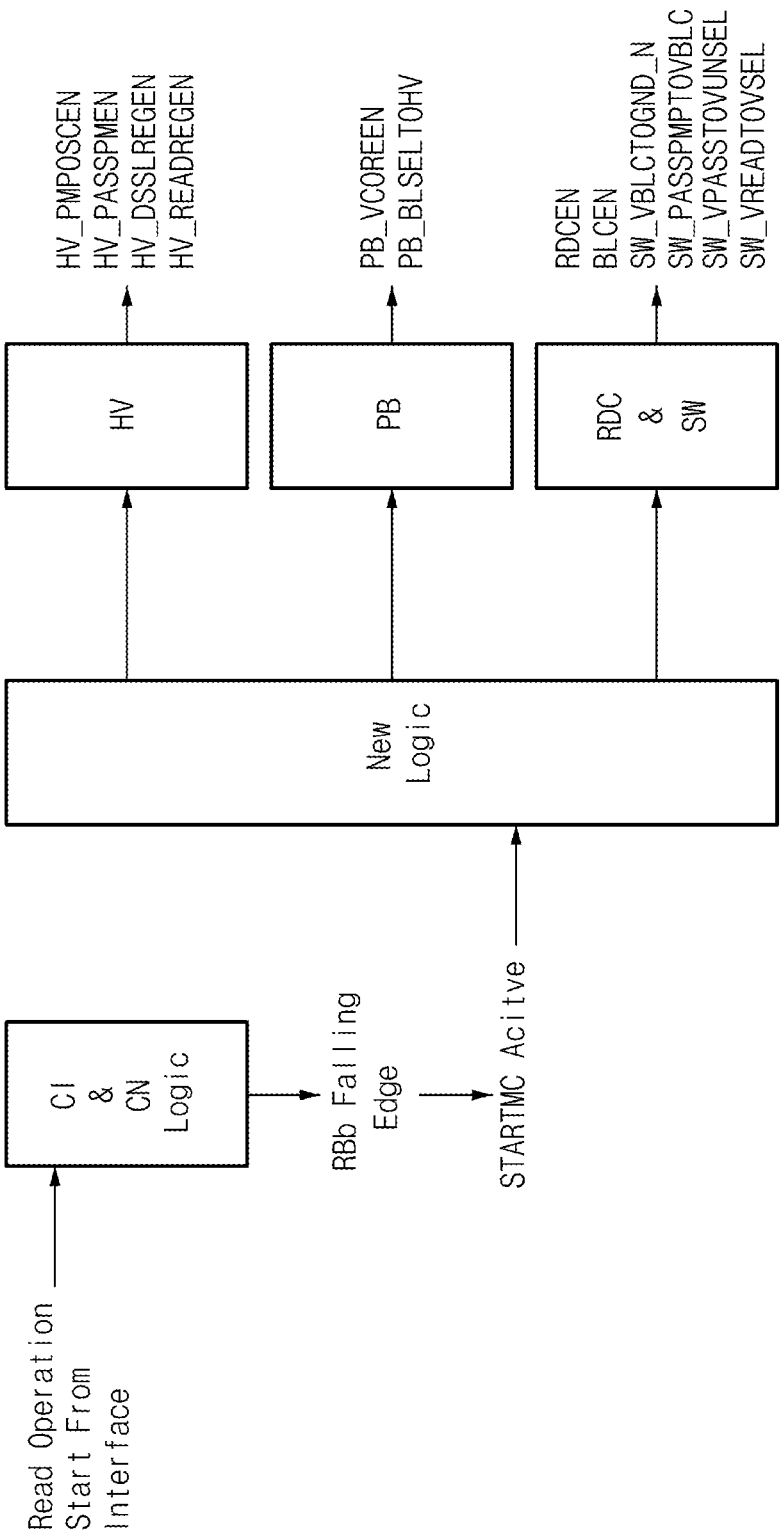
FIG. 6 is a conceptual view illustrating a method of operating a nonvolatile memory device according to an embodiment of the present disclosure.

FIG. 6 is a conceptual diagram illustrating a method of operating a nonvolatile memory device according to an embodiment of the present disclosure.

Referring to FIG. 6, a read command signal READ is provided through an interface (not shown) to a command interface logic (CI&CN logic). The command interface logic may correspond to the integrated activation signal generating circuit 210 of FIG. 2. Then, an integrated activation signal SMARTMC is activated when a ready/busy signal RBb is activated if a mode signal MODE is in an activated state. In an embodiment, the integrated activation signal SMARTMC is activated in response to a falling edge in which the ready/busy signal RBb changes from a logic state of 'high' to a logic state of 'low'.

A new logic included in the control logic 220 may simultaneously generate various control signals in response to the integrated activation signal SMARTMC. Thus, control signals such as an oscillation signal activation signal HV_PMPOSCEN for operating the voltage pump 150, an activation signal HV_PASSPMEN used for generating a voltage applied to a non-selected word line, an activation signal HV_DSSLREGEN used for generating a voltage applied to a selection gate SW for selecting a memory block, and an activation signal HV_READREGEN used for generating a voltage applied to a selected word line may be generated so that the voltage providing circuit 100 of FIG. 1 simultaneously generates voltages used to perform a read operation.

The new logic may also generate control signals such as a core voltage generating signal PB_VCOREEN and a control signal PB_BLSELTOHV for providing a core voltage Vcore to a specific bit line BL. As a result, the voltage providing circuit 100 generates the core voltage Vcore in response to the core voltage generating signal PB_VCOREEN, and a page buffer 500 of FIG. 1 provides the core voltage Vcore to a specific bit line BL of the memory cell array 600 in response to the control signal PB_BLSELTOHV. Here, the generation of the core voltage Vcore is performed in the voltage providing circuit 100. However, the core voltage Vcore is a voltage used to perform an operation of the page buffer 500, and thus the core voltage generation is classified as a function of the page buffer 500 in FIG. 6.

The new logic may also generate control signals for controlling electrical paths through which the voltages used to perform the read operation are provided to the memory cell array 600. Such control signals may include a row decoder activation signal RDCEN, a signal BLCEN for activating a specific memory block, a switch signal SW_VPASSTOVUNSEL for coupling an electrical voltage path to a non-selected bit line, a switch signal SW_VREADTOVSEL for coupling an electrical voltage path to a selected bit line, a high voltage transfer signal SW_PASSPMPTOVBLC for selecting a memory block selection, and a signal SW_VBLCTOGND_N for removing an existing ground state from the selected memory block to transfer a high voltage to the selected memory block.

As described above, a nonvolatile memory device according to embodiments of the present disclosure generate control signals for simultaneously performing functions such as voltage generation and electrical path connection in response to an integrated activation signal SMARTMC. As a result, the time it takes to perform a read operation can be minimized.

Further, a control logic used to implement a method of operating a nonvolatile memory device according to an embodiment of the present disclosure is simplified, and thus implementation of the entire operation of the nonvolatile memory device is also simplified. Further, since the operation of the nonvolatile memory device is selectively performed in response to a mode signal MODE, driving flexibility may be obtained.

The above embodiments of the present disclosure are illustrative and not limitative. Various alternatives and equivalents are possible. The present invention is not limited by the embodiments described herein. Nor are embodiments limited to any specific type of semiconductor device. Other additions, subtractions, or modifications are obvious in view of the present disclosure and are intended to fall within the scope of the appended claims.

What is claimed is:

1. A nonvolatile memory device comprising:
    a control circuit configured to generate an integrated activation signal based on a read command signal instructing start of a read operation and a ready/busy signal, and substantially simultaneously generate a voltage control signal and a path control signal in response to the integrated activation signal;
    a voltage providing circuit configured to generate voltages used to perform the read operation in response to the voltage control signal; and
    path control circuits configured to control an electrical path connection to a memory cell array in which the read operation is performed, in response to the path control signal.

2. The nonvolatile memory device of claim 1, wherein the control circuit includes:
    an integrated activation signal generating circuit configured to generate the integrated activation signal in response to the read command signal and the ready/busy signal; and
    a control logic configured to simultaneously generate the voltage control signal and the path control signal in response to the integrated activation signal.

3. The nonvolatile memory device of claim 2, wherein the integrated activation signal generating circuit includes:
    a logic operator configured to generate a command interface read signal based on the read command signal and a mode signal; and
    a flip flop configured to output the command interface read signal as the integrated activation signal in response to the ready/busy signal.

4. The nonvolatile memory device of claim 3, wherein the flip flop is configured to reset the command interface read signal in response to a reset signal.

5. The nonvolatile memory device of claim 1, wherein the voltage providing circuit includes a voltage pump, and
    wherein the voltage pump is configured to generate voltages, which are to be applied to a word line and a bit line of the memory cell array, in response to the voltage control signal and to generate voltages controlling electrical paths through which the generated voltages are provided to the word line and the bit line of the memory cell array.

6. The nonvolatile memory device of claim 1, wherein the path control circuits include:
    a row decoder coupled to a word line of the memory cell array;
    a page buffer coupled to a bit line of the memory cell array; and
    switches configured to control connections between the row decoder and page buffer and the memory cell array.

7. The nonvolatile memory device of claim 1, wherein the ready/busy signal is activated when a predetermined time elapses after the read command signal is activated, and
    wherein the control circuit generates the integrated activation signal in response to the ready/busy signal so as to generate the voltage control signal and the path control signal at substantially the same point of time.

8. The nonvolatile memory device of claim 1, wherein the generated voltages used to perform the read operation include a voltage applied to a selected word line of the memory cell array, a voltage applied to a non-selected word line, and a voltage provided to a bit line of the memory cell array.

9. A method of operating a nonvolatile memory device, the method comprising:
    generating an integrated activation signal based on a read command signal instructing start of a read operation and a ready/busy signal; and
    generating, at substantially the same point of time, control signals for controlling generation of voltages used to perform the read operation and control signals for controlling electrical paths through which the generated voltages are provided to a memory cell array, in response to the integrated activation signal.

10. The method of claim 9, wherein simultaneously generating the control signals at substantially the same point of time includes generating a voltage control signal and a path control signal in response to the integrated activation signal at substantially the same point of time.

11. The method of claim 10, further comprising:
    generating the voltages used to perform the read operation in response to the voltage control signal; and
    controlling the electrical paths through which the generated voltages are provided to the memory cell array in which the read operation is performed, in response to the path control signal.

12. The method of claim 11, further comprising providing the voltages used to perform the read operation to the memory cell array through the controlled electrical paths.

13. The method of claim 11, wherein the voltage control signal includes an oscillation signal, and
    wherein generating the voltages includes driving a voltage pump in response to the oscillation signal.

14. The method of claim 9, wherein generating the integrated activation signal includes:
    performing a logic operation on a mode signal and the read command signal; and
    outputting a result of the logic operation as the integrated activation signal in response to the ready/busy signal.

15. The method of claim 9, wherein generating the integrated activation signal includes:
    generating a command interface read signal by performing an AND operation on a mode signal and the read command signal; and providing the command interface read signal as the integrated activation signal in response to the ready/busy signal.

\* \* \* \* \*